March 21, 1967 N. GOLDSMITH 3,310,425

METHOD OF DEPOSITING EPITAXIAL LAYERS OF GALLIUM ARSENIDE

Filed June 28, 1963

INVENTOR.
NORMAN GOLDSMITH

BY

W. S. Hill

AGENT

United States Patent Office 3,310,425 Patented Mar. 21, 1967

3,310,425

METHOD OF DEPOSITING EPITAXIAL LAYERS OF GALLIUM ARSENIDE

Norman Goldsmith, Somerville, N.J., assignor to Radio Corporation of America, a corporation of Delaware Filed June 28, 1963, Ser. No. 291,488
1 Claim. (Cl. 117—106)

Figures 1, 2:
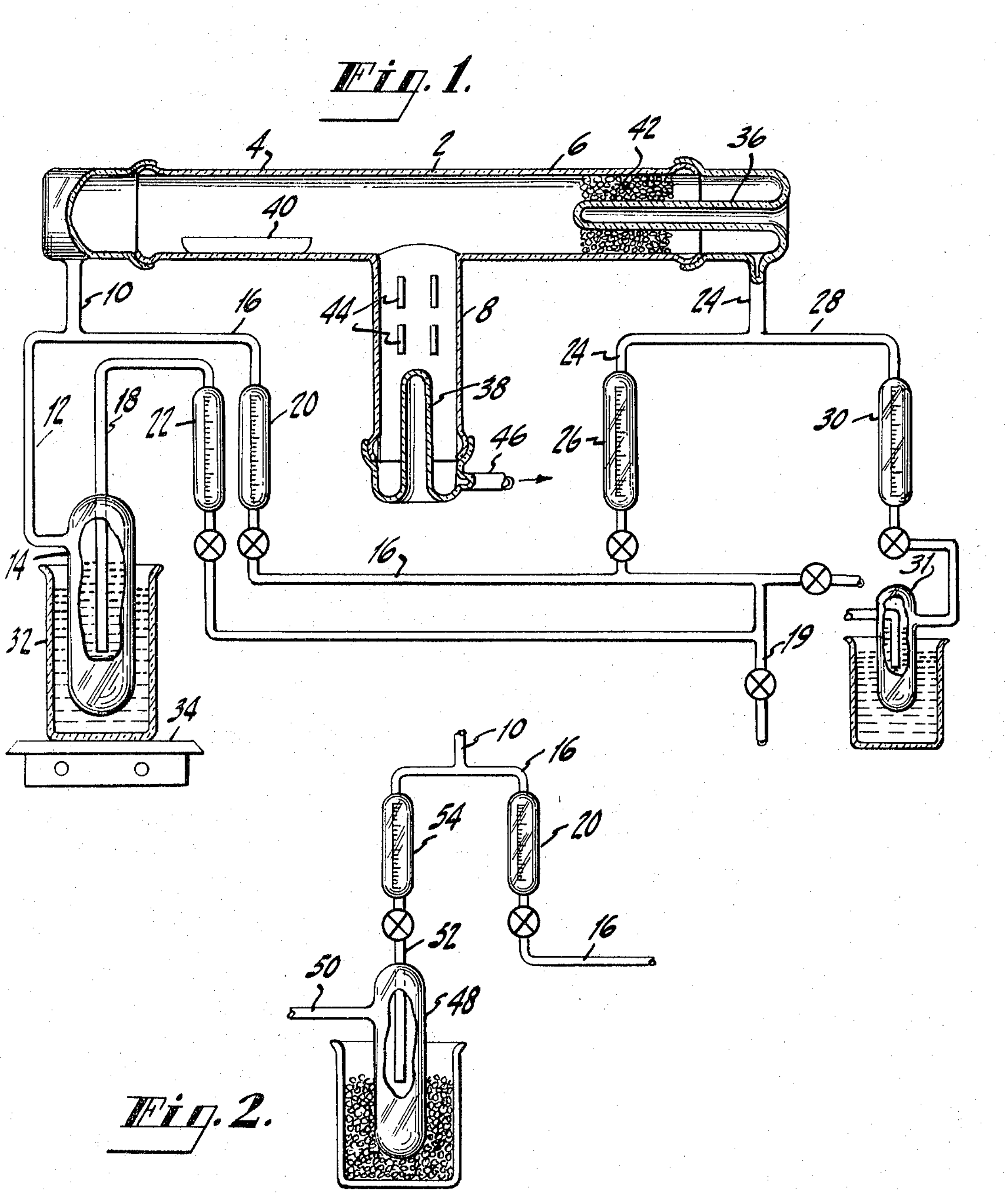

This invention relates to an improved method of depositing single crystalline layers of compound semiconductor materials and, more particularly, to depositing epitaxially-grown layers of these compounds on single crystal semiconductor bodies of the same substance or of a substance which has very similar lattice constants to those of the material being deposited.

Compound semiconductors are of interest to semiconductor device manufacturers because some of these substances have higher energy bandgap widths between the valence and conduction bands than those of presently known elemental semiconductors. This property of certain compound semiconductors permits devices which include bodies of these materials to be operated continuously at higher temperatures than devices made of elemental semiconductors such as germanium and silicon. In addition, since some of these compound semiconductors also have relatively high charge carrier mobilities under normal operating conditions, higher frequency operation of the devices is possible.

It has also been found that certain improvements in device operation can be obtained where epitaxially-grown layers of semiconductor material are deposited on a previously made crystalline body. The epitaxial layer is usually, but not necessarily, doped to opposite conductivity type than the base body. Advantages of using epitaxial layers in the production of devices which include P-type and N-type regions with rectifying junctions therebetween, are (a) the junction between the two layers can be made exceedingly abrupt and (b) the epitaxial layer can be doped uniformly throughout its thickness. There are other advantages such as accurately-controlled doping and uniformity of the junction over relatively large areas.

Because of the commercial interest in devices including epitaxially-grown layers of semiconductor material, many different ways have been devised for producing these layers. For example, a solution of impurities in a molten semiconductor is solidified on the surface of a semiconductor seed crystal. This method has been successful mostly with elemental semiconductors but has not been generally applied to compound semiconductors because these materials usually have one constituent which is much more volatile than the other and it is difficult to keep the composition under control. However, compound semiconductor epitaxial layers have been successfully grown by various vapor transport methods using halogens or halides as the transporting agent to carry the vaporized substances from sources of the compound constituents to regions where the compounds themselves are being deposited. Some of these methods have utilized closed tube systems, which are objectionable from the standpoints of danger of explosion and unadaptability to commercial production where continuous processes are desirable. In the open tube systems, further improvements have been desired in ease of control and uniformity of product.

One object of the present invention is to provide an improved method of growing epitaxial layers of compound semiconductor materials on seed crystals or on semiconductor bodies having the same or similar lattice constants to those of the layer being deposited.

A further object of the present invention is to provide an improved method of growing epitaxial layers of compound semiconductors utilizing an open tube system rather than a closed tube system.

A further object of the present invention is to provide an improved method of epitaxial layer growth of compound semiconductors which permits a wide, controllable variation in resistivity of the layer being deposited.

Another object of the invention is to provide an improved method of growing epitaxial layers of compound semiconductors while simultaneously doping the growing layer in a controlled manner.

Still another object of the invention is to provide an improved method of growing epitaxial layers of compound semiconductors which may be made either N-type or P-type or a combination of both types.

A principal feature of the present invention may be briefly described as an open tube method of growing an epitaxial layer of a semiconducting compound composed of a less volatile metallic and a more volatile non-metallic substance, on a substrate. The process comprises reacting a quantity of the less volatile metallic substance of the compound with a first halogen or halide vapor to form a lower halide of this less volatile substance in a stream of carrier gas, where the halide being reacted does not contain any metal other than that desired in the grown layer, while vaporizing a quantity of the more volatile substance of the compound in another stream of carrier gas, mixing the two streams of vapor at a predetermined temperature higher than the selected epitaxial growth temperature, and passing the heated mixture of vapors over a heated substrate of single crystal material having crystal lattice constants substantially the same as those of the compound being deposited, to thereby grow on the substrate an epitaxial layer of the compound.

More specifically, the metallic substance of the compound reacts with the first halogen or halide to form an equilibrium mixture of vapor of the first halogen or halide and lower halide of the metal. This equilibrium mixture and stoichiometric excess of the non-metallic substance of the compound are brought together and reacted at a temperature somewhat higher than the temperature which has been selected for growing the epitaxial layer. Some of the desired compound is formed in vapor phase and may deposit on the walls of the reaction chamber. The remainder of the reaction mixture then is caused to pass on over the heated single crystal substrate where the desired single crystal epitaxial layer is grown.

A further feature of the invention comprises regulating the partial pressure of the more volatile substance over the growing layer by controlling the temperature of the source of the more volatile substance. By varying the temperature of the source of the more volatile substance in a controlled manner, the resistivity of the growing layer can be similarly selectably controlled. It is thus possible to prepare layers with resistivity gradients or to produce active P-N junctions within the layer.

The invention will now be more fully explained with reference to the accompanying drawing of which FIGURE 1 is a section view of apparatus, partly in schematic form, suitable for carrying out the method of the invention, and FIGURE 2 is a similar but partial view of a somewhat different form of apparatus suitable for practicing the method of the invention.

Referring now to FIGURE 1, one form of apparatus for carrying out the invention comprises a T-shaped reaction tube 2 having a left horizontal arm 4 for containing one of the reaction ingredients, a right horizontal arm 6 for containing another of the reaction ingredients, and a shank portion 8 for containing the substrate upon which epitaxial growth is to take place. The left horizontal arm of the reaction tube 4 has an inlet tube 10 at its outer end. The inlet tube 10 is branched, one branch 12 being connected to a bubbler 14 and the other branch 16 being connected to a source of hydrogen gas (not shown). An inlet tube 18, one branch of which is connected to a source of hydrogen gas (not shown), leads to the bottom of the chamber of the bubbler 14. A second branch 19 of the tube 18 is connected to a source of helium (not shown). The tubes 16 and 18 have flow meters 20 and 22, respectively, in the lines to measure flow rates of gas.

Hydrogen inlet tube 16 also has a branch 24 which includes a flow meter 26, this branch being connected to the outer end of the reaction tube arm 6. The branch inlet tube 24 itself is provided with a branch 28, including flow meter 30, to admit gaseous doping substances which first pass through a bubbler 31, when this is desired.

The bubbler 14 is immersed partially in a liquid bath 32 which is supported on a hot plate 34 for maintaining the temperature within the bubbler at a desired level. The inlet tubes 10 and 12 and the entire reaction apparatus 2 are provided with suitable heating means to maintain the various parts separately at different desired temperatures. The heating means is conventional and is not shown in the drawing.

The reaction tube arms 6 and 8 are also each provided with recesses 36 and 38, respectively, into which thermocouples may be inserted to constantly monitor the temperatures of the respective parts of the reaction apparatus with which they are associated.

In general, the apparatus is operated as follows. A quantity of the metallic substance of the compound being deposited, of the highest purity obtainable, is placed in a boat 40 located in the arm 4 of the reaction tube. A quantity 42 of the volatile substance of the compound being deposited is packed into the arm 6 of the reaction tube 2. Layers of substrate material 44 are placed in the shank portion 8. The bubbler 14 is partially filled with a halide to be used in the reaction and, by means of the hot plate 34, the liquid bath 32 is raised to a temperature sufficient to keep the halide in liquid form. When all the joints have been made tight, the apparatus is flushed out with helium admitted through the inlet tube 19. This removes all of the oxygen or air in the system. Hydrogen is then admitted through the inlet tube 16 and also is allowed to flow through the inlet 18, through the bubbler 14 where it picks up vapor of the halide, then through the tubes 12 and 10 and enters the left-hand arm 4 of the reaction tube. The temperature of the metallic substance of the compound in the boat 40 is raised to a desired degree and the halide vapor reacts with the metal, forming a lower halide which is in equilibrium with the first-mentioned halide.

Hydrogen is also admitted through the inlet tube 24 through the right-hand arm 6 of the reaction tube where it picks up vaporized portions of the volatile substance from the supply 42. The gaseous stream from the arm 4 of the reaction tube and from the arm 6 are mixed together at the joint of the T. At this point, some of the semiconductor compound is formed in the vapor phase and may deposit on the surrounding walls of the reaction chamber. The remainder of the reaction mixture, which includes unreacted volatile portions of the compound as well as a mixture of the halides, passes down the shank portion 8 of the reaction apparatus and passes over the substrates 44. These substrates are maintained at a temperature at least about 50° C. lower than the region where the arms of the T join. An epitaxial layer of the semiconductor compound grows on the substrate. If conditions are properly controlled, only solid state growth occurs with no extraneous deposit forming on the chamber walls at this point. Unreacted vapors are vented through outlet tube 46.

A more specific example of the method will now be given, including particulars for depositing gallium arsenide upon a substrate seed crystal of gallium arsenide.

*Example I*

In depositing gallium arsenide in the form of an epitaxial layer, gallium and arsenic of utmost purity are selected. A quantity of gallium metal is placed in the bottom of the boat 40 and arsenic 42, either in the form of pieces placed in the bottom of the reaction tube arm 6 or as a coating deposited on the walls of the tube, is utilized as the other ingredient in the reaction. In this example, the halide used in the bubbler 14 is gallium trichloride, maintained at 85° C., which is prepared by the reaction of gallium with chlorine, followed by distillation in quartz and zone refining. Since gallium trichloride is hygroscopic and quite reactive, the gallium trichloride, after being zone refined, should be introduced into the bubbler without any intermediate exposure to either moisture or air.

Hydrogen is bubbled through the gallium trichloride at a rate of 50 cc. per minute and this resulting mixture is diluted with hydrogen entering through inlet tube 16 at a rate of 250 cc. per minute. Hydrogen is flowed over the arsenic 42 from inlet tube 24 at a rate of 250 cc. per minute. The arm 4 of the reaction tube is maintained at a temperature of 750° to 850° C., the center joint of the T is maintained at about 800° C., the arm 6 is maintained at 400°–450° C., and the substrates 44 are maintained at 600° to 750° C.

Gallium trichloride reacts with the heated gallium (which is in the molten state) according to the following reaction:

$$Ga + GaCl_3 \rightleftarrows 3GaCl$$

The temperature over the gallium and at the joint of the T are selected to provide a ratio of gallium monochloride to gallium trichloride which will provide a concentration of gallium over the substrate which is neither too high nor too low for reasonably rapid, smooth, uniform growth. It has been found that this desired result occurs when the substrate is maintained at a temperature between about 600°–750° C. and the temperature at the joint of the T is at least about 50° C. higher.

At the joint of the T, the equilibrium mixture of halide reacts with arsenic as follows:

$$\underset{\text{vapor}}{As_2 + 3GaCl} \rightleftarrows \underset{\text{solid}}{2GaAs} + GaCl_3$$

Temperature at this point may, for example, be about 800° C. The gallium arsenide which is formed as a solid in this reaction deposits on the walls of the reaction chamber.

The remainder of the reaction mixture passes down the shank portion of the T-shaped chamber over the substrate wafers 44 and GaAs grows as an epitaxial layer on the wafers. The stages of the growth reaction are believed to be as follows:

$$\underset{\text{vapor}}{3GaCl} \rightleftarrows \underset{\text{surface vapor}}{2Ga + GaCl_3}$$

$$\underset{\text{surface vapor}}{2Ga + As_2} \rightleftarrows \underset{\text{solid}}{GaAs}$$

Gallium is believed to first deposit on the substrate surface and then react with arsenic atoms to form gallium arsenide in the solid state directly without going through a vapor phase.

Proper preparation of the substrate wafers is important. The crystal from which the gallium arsenide substrate wafer is to be cut is so oriented that the wafers will preferably have a major face in the 100 plane to provide superior results. However, it is also possible to use either the A or B modifications of the III plane with satisfactory results.

The substrate surface should meet two basic requirements. It must be chemically clean and physically undisturbed. A chemically clean surface is substantially achieved by taking great care during all stages of preparation of the crystal and the substrate wafer to prevent undesirable foreign atoms from contaminating the gallium arsenide. Deionized water, doubly distilled in quartz, is used in all rinsing steps, and residual impurities are removed from the etching solution to the extent possible. Even with the best precautions, it is not desirable to store prepared wafers for an extended period since contamination occurs from paraffinic hydrocarbons from pump vapors, and exudations from the skin of the persons preparing the materials, so that the clean hydrophillic surfaces of the crystal can be rendered hydrophobic in a matter of minutes. It is therefore preferred to give the wafers a five minute etch within minutes of being used.

The physically undisturbed surface is best obtained by chemical removal of material rather than by abrasive action. An etchant, composed of five parts concentrated sulfuric acid, one part water, and one part 30% hydrogen peroxide, by volume has been found to give surfaces which show only a small trace of orange peel after one hour etch. When the etching is carried out in a rotating beaker, about 200 microns depth of material are removed in a one hour period of etching. If a flatter surface is desired, the wafer may first be lapped with a succession of decreasing grit sizes, and the resulting work damage removed by etching in a rotating beaker with the deposition surface up.

After the cleaning operation as described, the substrate wafers are placed in a slotted quartz boat so that they stand vertically with their sides parallel to the gas stream. This is done to minimize the possibility of solid pieces of gallium arsenide, which have nucleated in the gas phase, landing on the surface and providing spurious nucleation sites. It is also desirable to purge the entire system with hydrogen for about one-half hour before beginning the actual deposition process.

When all condtions are properly arranged, no gallium arsenide should be observed to form within the deposition zone except on the gallium arsenide substrate wafers. Air leaks in the system tend to produce irregularities in the layer which is being grown and when these are observed, the apparatus should be carefully checked for air leaks.

With a tight system, a growth rate of 13.8 microns per hour has been normally attained and this can be increased to 25.7 microns per hour by raising the gallium temperature 50° C.

In the foregoing example of the growth of an undoped layer of gallium arsenide has been described. However, doped layers can be grown by depositing a suitable doping agent simultaneously with the growth of the epitaxial layer.

To deposit a P-type layer of gallium arsenide, zinc, for example, may be utilized as the doping agent. One way to accomplish the zinc doping is to include a small amount of zinc mixed with the gallium metal in the boat 40. Using the proportion of 6 mg. of zinc to 20 g. of gallium has resulted in doping the grown layer with about $2 \times 10^{19}$ charge carriers per cm.$^3$. Lower proportions of zinc to gallium result in correspondingly lower concentrations of charge carriers in the grown layer.

Another way to dope the grown layer with zinc is to place a small amount of a zinc salt, such as $ZnCl_2$ in the side arm 6 of the reaction apparatus adjacent the arsenic. Any convenient quantity of zinc chloride can be placed in the reaction tube between the arsenic 42 and the inlet of tube 24 into the reaction tube. The temperature of the zinc salt is maintained between about 100° and 300° C. depending on the extent of doping desired. Also, the temperature can be varied during deposition of the layer if a graduated doping profile is desired.

The epitaxial layer may be doped N-type utilizing sulfur or selenium as the doping agent, for example. Referring again to FIGURE 1, sulfur doping may be accomplished by placing a quantity of $S_2Cl_2$ liquid in the bubbler 31 and passing in hydrogen to pick up the vapor, which then passes through the flow-meter 30 and the inlet tube 28 to enter the arm 6 of the reaction apparatus. The $S_2Cl_2$ may be kept at room temperature or cooled somewhat below room temperature. Flow rate of hydrogen through the liquid is preferably between about 1 cc./min. and 3 cc./min. depending on doping concentration desired.

Hydrogen sulfide may also be employed as the source of the sulfur used in doping the epitaxial layer. The hydrogen sulfide is preferably diluted with hydrogen to give a concentration of between 0.01% and 1.0% by volume and flow rates of hydrogen of 1 cc.–30 cc./min. have been used depending upon doping concentration desired.

Another way to control the conductivity type and to control the resistivity of the growing epitaxial layer is to control the partial pressure of the more volatile constituent of the compound being deposited, over the growing layer. For example, varying this partial pressure in a controlled manner is useful in growing layers with resistivity gradients which are difficult to obtain by other previously known methods. Control of this pressure is also useful in growing epitaxial layers of predetermined uniform resistivity by keeping the partial pressure constant and for producing active P-N junctions within the epitaxial layer.

In the case of growing epitaxial layers of gallium arsenide, the resistivity control may be obtained by regulating the temperature of the arsenic source.

If no extra doping agent is employed in growing an epitaxial layer of gallium arsenide by the method of the example which has been described above, the layer which is grown will normally be N-type with a net carrier concentration of the order of $10^{16}$ atoms per cc.—for reasons not fully understood. That is, the layer will be N-type if the temperature of the arsenic source is kept below 455° C., the hydrogen flow rate over the arsenic is about 230 cc./min. and the diluting flow from the gallium zone is about 260 cc./min. of hydrogen.

The following table illustrates how control of the arsenic pressure in the system can be used to control the resistivity of grown epitaxial layers of gallium arsenide. The method used to grow the layers was as described above with a hydrogen flow rate over the arsenic of 230 cc./min. and over the gallium of 260 cc./min. P-N junctions were fabricated from the different layers which were formed by growing N-type layers of gallium arsenide on N-type substrates of the same substance, diffusing in zinc to change part of the epitaxial layer to P-type and attaching suitable electrodes. The diode breakdown voltage was then measured with the junction biased in the reverse, or high resistance, direction.

Diode junction breakdown voltage is related to resistivity (or net carrier concentration) of the epitaxial layer, so that the higher the resistivity of the layer, the higher the diode breakdown voltage.

*Table*

| Diode breakdown volts: | Arsenic temp., ° C. |
|---|---|
| 20 | 400 |
| 55 | 408 |
| 90 | 416 |
| 180 | 433 |
| 215 | 442 |

If the flow rate of hydrogen over the gallium is increased, the arsenic temperature must be increased to maintain the same partial pressure of arsenic over the substrate. And if the arsenic temperature is varied either in an increasing or decreasing manner within this range, the grown layer can be made to have a corresponding resistivity gradient in its thickness dimension.

The illustrative example described above employs a chloride which is a liquid at ordinary room temperature, to be vaporized and reacted with the metallic portion of the compound. The halide can also be one which is normally a gas, such as hydrogen chloride. To make use of a gaseous chloride a slight modification of apparatus is desirable.

Referring to FIGURE 2, the bubbler 14 is replaced with a cold trap 48 having a gas inlet tube 50. Leading out of the cold trap to the reaction tube is an outlet tube 52 and a flow meter 54. Hydrogen chloride gas is admitted into the cold trap through the inlet tube 50 with the trap maintained at about −77° C. to remove condensable substances from the gas. The hydrogen chloride is maintained at a very low flow rate of about 2 cc./min. and is diluted with hydrogen admitted through tube 16 at 250 cc./minute before being passed over the metal in the boat 40. The remainder of the process is the same as previously described.

Epitaxial layers of gallium phosphide have been grown on gallium phosphide substrates, red phosphorus being substituted for the arsenic.

Although specific examples of the process have been given using liquid and gaseous chlorides, other halogens and halides can be substituted. For example, both elemental iodine and bromine have been successfully used, and HI or HBr may also be used.

What is claimed is:

An open tube method of growing an epitaxial layer of gallium arsenide comprising (a) passing a stream of hydrogen containing vaporized gallium trichloride over molten gallium which is at a temperature of 750° C.–850° C. to form a lower halide of gallium, (b) vaporizing arsenic at 400° C.–450° C. in another stream of hydrogen, (c) combining said streams at a temperature of about 800° C., and (d) passing the combined streams over a substrate of single crystal gallium arsenide being maintained at a temperature of about 600° C.–750° C., (e) to thereby grow on the substrate an epitaxial layer of gallium arsenide.

References Cited by the Examiner

UNITED STATES PATENTS

| | | | |
|---|---|---|---|
| 3,094,388 | 6/1963 | Johnson et al. | 23—204 |
| 3,145,125 | 8/1964 | Lyons | 117—106 X |
| 3,218,205 | 11/1965 | Ruehrwein | 252—62.3 |
| 3,224,913 | 12/1965 | Ruehrwein | 252—62.3 |

ALFRED L. LEAVITT, *Primary Examiner.*

A. GOLIAN, *Assistant Examiner.*